United States Patent [19]

Wyckoff

[11] 4,263,583

[45] Apr. 21, 1981

[54] DIGITAL ALARM SYSTEM WITH VARIABLE ALARM HYSTERESIS

[76] Inventor: Richard Wyckoff, Box 81, R.F.D. #2, Wiscasset, Me. 04578

[21] Appl. No.: 971,097

[22] Filed: Dec. 19, 1978

[51] Int. Cl.[3] ...................... G08B 23/00; H03K 21/34

[52] U.S. Cl. .................................... 340/501; 340/588; 340/589; 340/661; 328/48; 328/162; 324/98; 340/870.43

[58] Field of Search ............... 340/500, 501, 588, 589, 340/661, 662, 663, 181, 186, 187; 328/162, 165, 48, 133; 324/99 D, 98; 364/550, 551, 557; 11/11; 73/1 R, 1 F; 307/234

[56] References Cited

U.S. PATENT DOCUMENTS

| | | | |
|---|---|---|---|
| 3,214,700 | 10/1965 | Hook | 340/661 |
| 3,588,710 | 6/1971 | Masters | 328/133 |
| 3,735,273 | 5/1973 | Wright et al. | 328/162 |
| 3,832,577 | 8/1974 | Harr | 328/162 |
| 3,956,705 | 5/1976 | Mayer | 328/133 |
| 4,101,839 | 7/1978 | Poole et al. | 328/162 |
| 4,161,628 | 7/1979 | McRae | 328/162 |

*Primary Examiner*—John W. Caldwell, Sr.
*Assistant Examiner*—Donnie L. Crosland
*Attorney, Agent, or Firm*—Nicholas J. Aquilino

[57] ABSTRACT

A digital alarm system for monitoring a variable process signal utilizing a variable, digitally controlled alarm hysteresis capability. The system includes a means for establishing a preselected count level at which an alarm condition occurs. The preselected count level may be established in a high alarm or a low alarm state depending upon the process signal being monitored. Digital signals representative of the process variable are compared with the preset count level signals and upon a coincidence, an output signal is generated to provide alarm signals and also to reset the preselected count level signal to a second preselected count at a level which is a wide variation from the original preselected level so a relatively large change in the process signal occurs before the system is reset to its original alarm condition.

23 Claims, 1 Drawing Figure

DIGITAL ALARM SYSTEM WITH VARIABLE ALARM HYSTERESIS

BACKGROUND OF THE INVENTION

In any industry that utilizes instrumentation to monitor and/or control a process, such as temperature of a fluid or pressure in a tank, it is highly desirable, if not mandatory, to have an indicator of the process variable. Prior art devices include using moving pointer meters and strip chart recorders to monitor the variations in the process signal.

The present state of the art calls for digital panel meters to monitor and display the process variable signal. This type of system has the advantage of being able to display the process variable signal directly in the engineering units desired; for example, pressure or temperature. This is simply a matter of calibrating the meter in units of measured process signals.

Where controls of one type or another are needed, digital panel meters of this type provide alarms which can be set to either a high or low condition to thus provide additional control capabilities which do not require human interfacing in order to be effective. For example, on the scale of zero to one thousand, a process temperature may operate satisfactorily in the range of 300 as a low point and 650 as a high point. An alarm incorporated in the system will be actuated when the process signal reaches a low point of 300. Furthermore, a second alarm may be actuated when the process signal exceeds a high reading of 650 or above. A shortcoming of the prior art systems occurs when the process signal fluctuates about either a high or low preset point. The fluctuations may occur due to various incremental changes in the process variable being monitored or because of noise conditions inherent in the system. Should the process signal fluctuate about a preset high or low point, a series of alarms and alarm resets could occur because of the variations of the process signal from the nominal steady state value.

Additionally, it is often desirable to have considerable control over where the alarm should reset in terms of the process variable which would be different from the original preset alarm figure. This would enable a system to be brought back into its normal operating condition without the equipment cycling on and off around the preset point.

In monitoring control systems of this type, the definition of hysteresis as it relates to this area of control is the difference between the control actuation set point and its reset point. This difference is often expressed as a percentage of the full indicated process range.

It is known in the prior art to prevent fluctuation of a least significant digit in a meter as shown in the U.S. Pat. Nos. 3,551,809 to Dufour; Miller 3,621,391; and Gray 3,728,524. However, this capability has not been heretofore used in a process variable system wherein significant shifting of the reset point is provided to precisely control the set point change.

Most systems of this type use digital alarm comparators which have no hysteresis and, thus, will cause an alarm reset to occur as soon as the least significant digit of the variable data changes out of alarm coincidence. When dealing with physical devices, such as pumps, heaters, volumes of liquid, temperature, and so forth, which by their nature demand latitude in fluctuations in their control, these digital alarm comparators find their usefulness extremely limited. For example, in a digital process metering loop providing either high or low alarm detection of some process variable which is being monitored by an analog based transmitter and which is subsequently converted to a digital signal for both alarm and display purposes, the required hysteresis effect necessitates the use of two alarm comparators of different configurations with external logic circuitry such that one can start the process variable device and the other can stop it. In addition to this, electronic noise present in the signal loop can cause a variation of several digits around the least significant point which is beyond the range of present analog to digital antiflutter circuits thereby causing alarm sets and alarm resets such that the digital alarm comparators used in these situations are useless.

SUMMARY OF THE INVENTION

The present invention relates to a digital alarm device which provides a variable digitally controlled hysteresis capability. The system includes a means to sense a preset alarm condition in both a high and low configuration. After the alarm condition is sensed, a clock signal is gated to a preloaded, up/down set point counter so as to add or subtract from the preselected set point depending upon the alarm configuration. This creates a precisely controlled set point change whereby once the alarm condition is encountered, a relatively large variation in the process signal being monitored must occur before reset is accomplished. The system further provides that upon alarm reset, a load pulse is generated to re-establish both the originally desired high or low alarm set point and the hysteresis count.

It is the principal object of the present invention to provide an improved digital alarm control system capable of sensing a predetermined alarm control point condition, to provide an alarm and maintain it despite minor fluctuations in the signal being monitored.

A further object of the present invention is to provide an improved digital alarm comparator system having a digital hysteresis capability.

An additional object of the present invention is to provide an easy changeable means to vary the exact amount of hysteresis employed in the digital alarm comparator.

DESCRIPTION OF THE PREFERRED EMBODIMENTS

Figure 1:
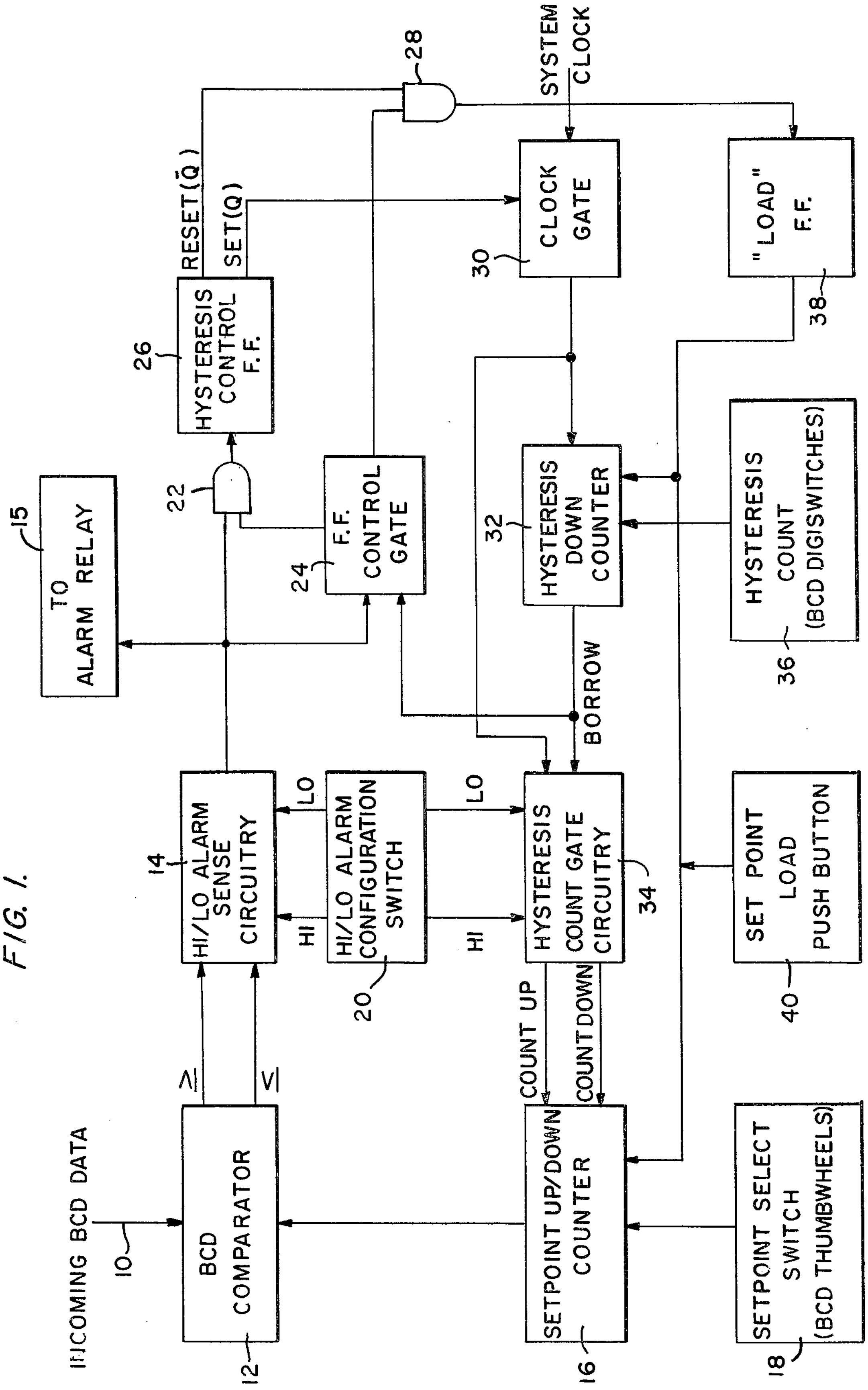
FIG. 1 is a block diagram of the digital alarm system of the present invention.

A digital alarm system in accordance with the present invention is provided with a variable, digitally controlled alarm hysteresis capability.

When monitoring a process variable so that it will normally operate within a predetermined range, the system provides for an alarm condition signal when the process variable signal exceeds a preset high condition or falls below a preset low condition. When the system operates at or near either the high or low set point, a continuous series of alarms and alarm resets caused by minor fluctuations around the preset points are eliminated in the present system by shifting the reset values a significant number of digits, when an alarm condition is sensed, using an up/down set point counter. The number of digits the up/down counter is set away from the preset points is adjustable manually and may depend upon the variables in the process being monitored. Once the process signal being monitored returns to a normal condition, the system resets and the original high or low preset value is re-established.

The digital alarm system of the present invention is shown with reference to FIG. 1. An input line 10 is coupled to a source (not shown) of binary coded decimal or binary digital information which may represent some analog value, such as pressure, temperature, fluid flow and so forth. The input line 10 is coupled to a BCD comparator 12, the output of which is fed to a high-low alarm sense circuit 14. The comparator 12 is regulated by a set point up and down counter 16 which is operated by a set point selector switch 18 which preferably may be a thumb wheel type of switching arrangement. The high-low alarm sense circuit 14 is regulated by a high-low alarm configuration switch 20. The output of the alarm sense circuit 14 is fed to one input of an AND gate 22, to an alarm relay 15 and to a flip flop control gate 24. The second input of the AND gate 22 is controlled by the flip flop control gate 24. The output of the AND gate 22 is connected to a hysteresis control flip flop 26 which provides a reset output connected to one input of AND gate 28 and a set output connected to a clock gate 30. The system clock pulses are fed to another input in the clock gate 30. The output of the clock gate is connected to a hysteresis down counter 32 and to one input of a hysteresis count gate circuit 34. The second input to the hysteresis count gate circuit 34 is obtained from the output of the hysteresis down counter 32. A high and low configuration input from the high-low alarm configuration switch 20 is also connected to the hysteresis count gate circuit 34. The output of the hysteresis count gate circuit 34 may take the form of a count up signal or a count down signal which is connected to the set point up/down counter 16.

Another output from the hysteresis down counter 32 is connected back to the flip flop control gate 24. An output of the flip flop control gate 24 is connected to the second input of gate 28. The hystersis down counter 32 is controlled by a hysteresis count switch 36. The output of gate 28 is fed to a load flip flop 38 which, in turn, feeds its output to the hysteresis down counter 32 and to the set point up/down counter 16. A set point load push button 40 is also connected to the set point up/down counter 16.

The operation or system may be described as follows. Incoming binary coded decimal information from the source 10 is fed to the BCD comparator 12. The comparator makes a continuous bit-for-bit comparison between the incoming BCD data and the information supplied from the set point up/down counter 16. When coincidence is detected between the input signals and the data from the set point up/down counter 16, an output is provided from the comparator 12 to the alarm sense circuitry 14. Depending upon the position of the high-low alarm configuration switch 20, the alarm sense circuitry will detect the proper comparator output. Assuming that the high alarm condition is to be monitored and a high alarm condition exists, the alarm sense circuitry 14 will cause a logical one to be applied to the alarm relay 15 and also to AND gate 22 which, along with a signal from the flip flop control gate 24, enables the AND gate 22. The function of the flip flop control gate 24 is to determine if the hysteresis control flip flop 26 is set up correctly for an alarm condition or an alarm reset condition. In this case, the hysteresis control flip flop 26 is reset or, in other words, its reset queue line is a logical "1" and its set queue line is a logical "zero". Thus, the flip flop control gate 24 input to AND gate 22 is a logical "one" prior to the alarm condition which causes it to be enabled when the alarm signal is received from the alarm sense circuitry 14 and to change its output from a logical "zero" to a logical "one". This output then triggers the hysteresis control flip flop 26 which causes the outputs set queue and reset queue to simultaneously change state.

The purpose of the hysteresis control flip flop is to act as a memory for the remainder of the control circuitry. It is so configured as to change state with either the alarm line going to a logical "one" condition or the control gate fluctuating from a logical "one" condition to "zero" and back to "one" in synchronization with the signal generated by the hysteresis down counter 32. The output lines of the hysteresis control flip flop are then used to enable clock gate 30 or the load flip flop 38 through gate 28 but never both simultaneously.

In a no-alarm condition, the clock gate 30 is disabled and the load flip flop 38 is enabled so as to output a fixed width pulse upon sensing a transition of its input line. Since the gate 28 has a logical "zero" applied to one of its inputs from the flip flop control gate 24, when an alarm condition occurs, the reset queue line from the hysteresis control flip flop 26 goes from a logical "one" to "zero" which changes the output of the gate 28 from a "one" to a "zero". This transition triggers load flip flop 38, which is a one-shot monostable multivibrator, to generate a fixed duration load pulse which is negative going or, in other words, which goes from a "one" to a "zero". This load pulse is connected to both the hysteresis down counter 32 and the set point up/down counter 16 thus ensuring that the set point up/down counter 16 has the latest set point information available. The hysteresis down counter 32 and the set point up/-down counter 16 are both presettable up/down counter integrated circuits and the load pulse causes both counter 32 and 16 to be loaded with the BCD data present on their input lines which is derived from the set point selector switch 18 or the hysteresis count switches 36 for the set point up/down counter 16 and the hysteresis down counter 32, respectively. The load pulse, therefore, is important in that it establishes correct data in both the counters 16 and 32 just prior to the first hysteresis count being felt.

The set queue line of hysteresis control flip flop 26, going from a logical "zero" to a "one", enables the clock gate 30 which now passes clock pulses at whatever rate they are externally generated from the system clock source.

The clock pulses are applied to the hystersis down counter 32 and to the set point up/down counter 16 through the hysteresis count gate circuit 34. The clock pulses cause the hysteresis down counter 32 to count down to zero from whatever predetermined count was loaded from the hysteresis count switches 36. The hysteresis count circuit 34 is essentially a steering circuit which is comprised of gates which steers the clock pulses to either the count-up or count-down line of the set point up/down counter 16 depending upon the position of the high/low alarm configuration switch 20. In the case of the high alarm condition, the switch 20 causes the clock pulses to be applied to the count-down line of the set point up/down counter 16. Therefore, both the counters 16 and 32 will commence counting down from the pre-established counts.

When the hysteresis down counter 32 reaches a zero count, its borrow output line transitions from a logical "one" to a logical "zero". The hysteresis count gate circuit 34 is disabled and no further clock pulses can be applied to the set point up/down counter 16. Also, the logical "zero" output from the hysteresis down counter 32 triggers the flip flop control gate 24, which then triggers the hysteresis control flip flop 26 and the clock pulses cease. Thus, the hysteresis effect is accomplished since the process variable input BCD data 10 into the BCD comparator 12 must numerically fall below that of the output of the set point up/down counter 16. This creates a new set point for the BCD comparator 12 which is a value which reflects the addition or subtraction of the original contents of the hysteresis down counter 32 to the original value of the set point up/-down counter 16 itself. In the case of the high alarm condition, the new set point is numerically equal to or lower then the original set point.

The transition of the borrow line of the hysteresis down counter 32 through the flip flop control gate 24 and the hysteresis control flip flop 26 causes the output line to the gate 28 to transition from a "zero" to "one" to "zero" in synchronization with the borrow signal of the hysteresis down counter 32. Also, the output line from the flip flop control gate 24 to the AND gate 22 transitions from a "one" to a "zero" to a "one" which causes the hysteresis control flip flop 26 to change state. As a result of both signals to the gate 28 changing, the gate 28 output transitions from a "zero" to a "one" and it stays there. This transition is positive going and does not trigger the load flip flop 38 since it triggers on negative going signals only.

When the alarm signal finally clears as a result of the process variable going below the set point up/down counter 16 count, the alarm relay 15 and the AND gate 20 input line transitions from a "one" to a "zero". This causes the AND gate 20 to go to "zero" and stay there and has no effect on the hysteresis control flip flop 26 since it triggers only on a positive going transition. Also, the alarm relay is disabled. However, the flip flop control gate 24 output to the OR gate 28 transitions and causes a load pulse to be generated which re-establishes the alarm set point and prepares the device for another alarm.

In the low alarm mode, the high-low alarm configuration switch is moved to the low position which causes the hysteresis count gate circuitry 34 to output on the count up line to the set point up/down counter 16. Essentially, the same steps as described with respect to the high alarm condition are then accomplished by the circuits except that the counts are measured in the opposite direction.

The set point load push button 40 allows for manual loading of a new set point should one be desired and merely holds load flip flop 38 output low as long as it is depressed.

Thus, it can be seen with the above arrangement that once an alarm condition is established, the reset is not accomplished until a significant variation is obtained from the alarm condition level.

It will be appreciated that the above description is a preferred embodiment only and that many variations may be made in the system which adhere to the scope of the invention as defined in the following claims.

What is claimed is:

1. A digital alarm system for monitoring a variable signal having a variable alarm hysteresis capability comprising:

input means providing digital signals representative of a process variable, means providing a preset count level signal representative of an alarm condition, comparator means for comparing the process variable signals from the input means and the preset count level signal, means sensing a coincidence in said comparator, and for generating an output signal in response to said coincidence, means for resetting said preset count level signal to a second value upon occurrence of said coincidence output signal, and alarm means responsive to said output signal for providing an alarm that said process variable signal has exceeded said preset count level signal value.

2. The system of claim 1 wherein said resetting means includes a second counter means connected to said first counter means for producing a second count signal to change said present level count.

3. The system of claim 2 further including means for presetting said second counter means to provide said second count signal.

4. The system of claim 3 wherein said presetting means comprises variable switches.

5. The system of claim 1 further including means for establishing a high or low alarm condition response in said sensing means.

6. The system of claim 5 wherein said establishing means is a switch adapted to be set in a high or low alarm position.

7. The system of claim 1 further including control means for establishing the system in an alarm set or alarm reset condition.

8. The system of claim 7 wherein said control means is a flip flop providing a positive or negative output in response to the system condition.

9. The system of claim 8 further including a control gate for regulating the output of said control flip flop.

10. The system of claim 8 further including a first gate for enabling said control flip flop.

11. The system of claim 7 further including a source of clock signals and clock gating means connected to said clock signal source, said clock signal source and clock gating means connected to said control means whereby an output from said control means to said clock gating means establishes clock signals in the system.

12. The system of claim 3 further including means for setting said present counts in said first and second counters.

13. The system of claim 12 wherein said setting means includes a load flip flop for providing a negative going output pulse to said counters.

14. The system of claim 13 further including control means for establishing the system in an alarm set or alarm reset condition.

15. The system of claim 14 wherein said control means is a flip flop providing a positive or negative output in response to the system condition.

16. The system of claim 15 further including a gate connected between said control means and said load flip flop which is enabled by a negative output from said control means to operate said load flip flop.

17. The system of claim 11 wherein said clock signals are connected to said second counter means whereby said second counter means produces output clock pulses in accordance with said second counter presetting means when said clock gating means is enabled.

18. The system of claim 17 further including a count circuit means connected between said first counter means and said second counter means and a means connected to said count circuit means for establishing a high or low alarm condition whereby said count current means counts up or counts down clock pulses to said first counter in accordance with the high or low alarm condition establishing means.

19. The system of claim 1 wherein said means providing a preset count level signal is a first counter including means for varying the count level in said counter.

20. A method of monitoring a variable signal comprising, establishing a preselected count level signal representative of an alarm condition, measuring input signals representative of the variable being monitored, comparing said preselected count level signal with said measured input signals, generating an output signal in response to a coincidence between said signals, resetting said preselected count level signal to a second value different from the original preselected count level signal value, and providing an alarm means responsive to said output signal when said original preselected count level signal coincides with said variable signal input.

21. The method of claim 20 wherein said preselected count level signal represents a high alarm condition.

22. The method of claim 20 wherein said preselected count level signal represents a low alarm condition.

23. The method of claim 20 further including the step of re-establishing the system in a non-alarm condition by resetting said original preselected count level signal when said process variable signals being measured reach said second preselected count signal.

* * * * *